United States Patent [19]

Hughes

[11] Patent Number: 4,682,111
[45] Date of Patent: Jul. 21, 1987

[54] MAGNETIC RESONANCE IMAGING MAGNET

[75] Inventor: Simon H. C. Hughes, Gurnee, Ill.

[73] Assignee: Kabushiki Kaisha Toshiba, Kawasaki, Japan

[21] Appl. No.: 708,448

[22] Filed: Mar. 5, 1985

[51] Int. Cl.$^4$ ............................................. G01R 33/20
[52] U.S. Cl. ..................................................... 324/320
[58] Field of Search ........................ 324/309, 319–320; 335/262, 298

[56] References Cited

U.S. PATENT DOCUMENTS

| | | | |
|---|---|---|---|
| 2,962,636 | 11/1960 | Purcell | 324/319 X |
| 3,417,356 | 12/1968 | Tschopp | 335/298 |
| 3,488,561 | 1/1970 | Anderson | 324/320 X |
| 3,622,869 | 11/1971 | Golay | 324/320 |
| 4,422,042 | 12/1983 | Sugimoto | 324/319 X |

FOREIGN PATENT DOCUMENTS

| | | |
|---|---|---|
| 5238995 | 9/1982 | Japan . |
| 5617552 | 1/1983 | Japan . |

OTHER PUBLICATIONS

"2D Correcting of Magnetic Field Inhomogeneities", by Kinsner & Poltz.
"Laboratory Manuals", by Kroon, D. J., Philips Technical Library, Eindhoven, 1968.
"Laboratory Magnets", by Kroon, D. J., Philips Technical Library, Eindhoven, 1968, pp. 172–193.

Primary Examiner—Michael J. Tokar
Assistant Examiner—Francis J. Jaworski
Attorney, Agent, or Firm—Finnegan, Henderson, Farabow, Garrett & Dunner

[57] ABSTRACT

A magnet for use in a magnetic resonant imaging device comprising pole pieces and a return magnetic path constructed of magnetic field conductive material and comprising activating coils, one located around each pole piece which, when activated, generate a magnetic field between the exposed faces of the pole pieces. To improve uniformity of the resultant magnetic field, the surface of the exposed face of each pole piece comprises a toroidal portion which may extend beyond the side surface of the cylinder of each pole piece and a concave portion surrounded by that toroidal portion. To further improve field uniformity, a plurality of projections extend from the expose surface of each pole piece toward the exposed surface of the opposite pole piece with the distance each projection extends from the exposed surface of the respective pole piece being hydraulically adjustable. To still further improve uniformity, a plurality of shim coils are arranged on the exposed surface of the first and second pole pieces, some of which shim coils are arranged with circular symmetry with regard to the exposed surface and some of which are arranged without circular symmetry.

12 Claims, 5 Drawing Figures

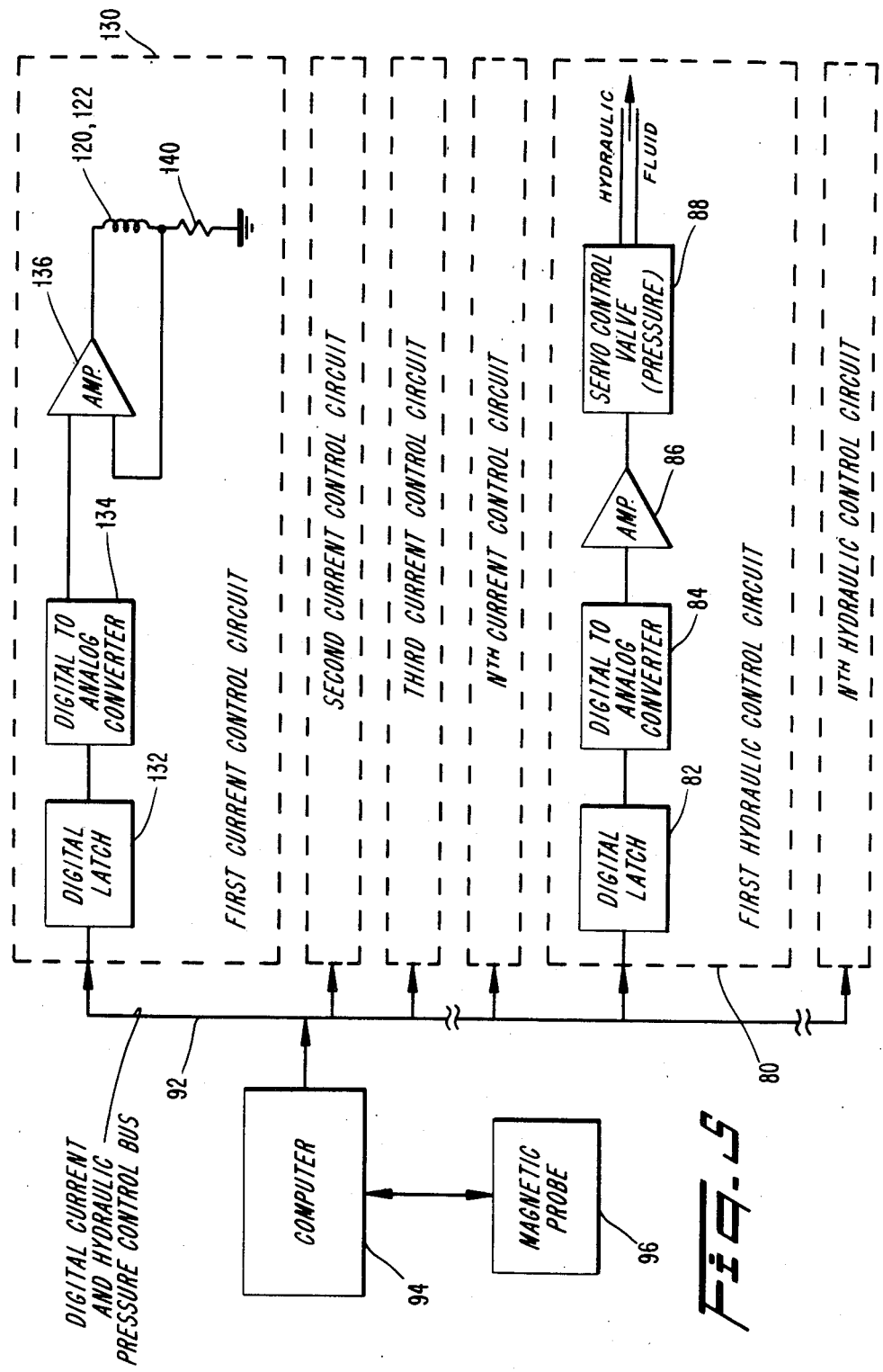

MAGNETIC RESONANCE IMAGING MAGNET

BACKGROUND OF THE INVENTION

I. Field of the Invention

The present invention relates to a magnet for a magnetic resonance imaging device.

II. Description of the Prior Art

Present day magnetic resonance imaging (MRI) devices employ a powerful magnet which may be constructed in one of three basic designs: resistive, superconducting or permanent.

Prior art magnets of the resistive type typically comprise four coils assembled in a psuedo-Helmholtz coil configuration. These four coils create, along their longitudinal axes, a relatively homogeneous magnetic field, the return path for which passes through the air outside of the confines of the coils. Additional shim coils are employed adjacent the four primary coils in order to increase the homogeneity of the resultant magentic field within the coils.

Such prior art magnets have a disadvantage in that the field shape within the coils is determined mainly by the critical location of the Helmholtz and shim coils and by the currents flowing through these coils. Adjustments to coil position and to coil currents are performed manually. In addition, because the returning magnetic field is not contained within such magnets, either a large clear space is required around such magnets or static field shielding is required. Moreover, the power consumption of such magnets is considerable. For a resistive magnet to produce a field strength of 1.5 kilogauss 50 kilowatts of power may be required.

Prior art magnets of a superconducting type are used to achieve higher field strengths for which the power requirements become prohibitive using conventional resistive techniques. However, at higher field strengths the returning field extends over a greater area outside the magnet, making static field shielding even more necessary and cumbersome. With this shielding superconductivity magnets may weigh as much as 60 tons. In addition, the equipment required to achieve superconductivity greatly increases the complexity and expense of the resultant system.

Permanent magnets have also been employed in MRI devices. Although permanent magnets do not require power and are therefore cheaper, such magnets have the disadvantage of being incredibly heavy. For example, such magnets weigh on the order of 100 tons to achieve a 3.5 kilogauss field. In addition, such magnets can not be turned off. Thus, permanent magnets may require disassembly if a metallic object becomes trapped against an exposed pole piece.

However, permanent magnets for use in MRI devices have the advantage of providing a return magnetic field contained within the magnet and, as a consequence, the magnet is substantially insensitive to external ferromagnetic objects.

To achieve the requisite uniform field between the pole pieces of the permanent magnet, attempts have been made to shape the exposed surfaces of the pole pieces. Specifically, at least one attempt has been made to shape an otherwise flat pole piece of a permanent magnet by employing a plurality of small adjustable screws which extend outward from the pole piece a distance which can be adjusted by setting of the screws.

As a consequence of the foregoing, attempts have been made in the prior art to develop a magnet for MRI devices which employs magnetically conductive metal pole pieces, preferably constructed of iron or an iron alloy, with a magnetic return path also constructed of magnetically conductive material, and which may further employ a pair of activation coils, one located around each pole piece to establish a magnetic field between those pole pieces. This form of magnet has the potential advantage of having a lower manufacturing cost than a Helmholtz air-core type magnet with similar performance.

The materials employed in such a magnet may be inexpensive, for example, simple iron. Since the field shape is not critically dependent on the position of the coil, and since the power dissipation is much lower, the coil manufacturing criteria are much less critical, and, therefore, less expensive, than for an air return path system of the Helmholtz variety. This reduced power dissipation also permits the use of a low cost heat exchanger or possibly no heat exchanger at all.

The weight of such an iron core magnet is anticipated to be on the order of 5-10 tons, assuming a field of 1.5 kilogauss. This compares very favorably with 100 ton for a permanent magnet device and 60 tons for superconductivity type device with shield. Moreover, since the return magnetic field is contained wtihin iron, and magnet is insensitive to external ferro-magnetic objects.

However, use of a non-permanent magnetic material as pole pieces severely limits the available mechanisms for establishing a field of the requisite high degree of homogeneity between the exposed faces of the pole pieces.

It is, accordingly, an object of the present invention to provide a magnet with non-permanent magnet pole pieces surrounded by activating coils and employing a magnetically conductive metal return path which magnet has a high degree of homogeneity in the magnetic field established between the exposed faces of those pole pieces upon activation of the coils.

Additional objects and advantages of the invention will be set forth in the description which follows, and in part will be apparent from the description, or may be learned by practice of the invention.

SUMMARY OF THE INVENTION

To achieve the foregoing objects, and in accordance with the purposes of the invention as embodied and broadly described herein, a magnet for use in a magnetic resonance image device is provided which comprises: (a) first and second pole pieces of magnetically conductive material, each pole piece having the shape of a cylinder and each pole piece having an exposed face at one end of the cylinder spaced apart from the exposed face of the other pole piece; (b) first and second coils located around the first and second pole pieces, respectively, to generate a magnetic field between the exposed faces of the pole pieces when the coils are energized; (c) additional magnetically conductive material arranged to provide a closed-loop magnetic flux return path for the pole pieces; and (d) means for uniformly distributing the magnetic field between the pole pieces comprising a surface on the exposed face of each pole piece which comprises a toroidal portion and a concave portion surrounded by the toroidal portion.

Preferably the toroidal portion is symmetrical and lies along the circumference of the cylinders of the pole pieces in a manner which projects at least a portion of the toroidal portion beyond the side surface of those cylinders.

It is further preferable that the concave surface have a circular edge, the center of curvature of which lies along the axis of symmetry of the cylinders, with the circular edge having the same height and same slope as the height and slope of the edge of the toroidal portion at the points of contact between the toroidal portion and the concave portion to provide a smooth transition between those two portions.

In accordance with a further aspect of the subject invention, the means for uniformly distributing of the magnetic field between the pole pieces further comprises a plurality of projections extandable from the exposed surface of at least one of the pole pieces toward the exposed surface of the other pole piece and means for hydraulically adjusting the distance each projection extends from the exposed surface of the at least one pole piece.

Still further in accordance with the present invention, the means for uniformly distributing the magnetic field between the pole pieces further or in the alternative includes a plurality of shim coils arranged on the exposed surface of the first and second pole pieces, with at least a portion of the shim coils arranged without circular symmetry with regard to the exposed surfaces of the pole pieces.

It is still further preferable that the means for hydraulically adjusting the pole projections be computer controlled and that activation of the shim coils also be computer controlled.

BRIEF DESCRIPTION OF THE DRAWINGS

The accompanying drawings, which are incorporated in and constitute a part of the specification, illustrate a preferred embodiment of the invention and, together with the general description of the invention given above and the detailed description of the preferred embodiment given below, serve to explain the principles of the invention.

FIG. 5 is a block diagram of a computer control circuit for the subject magnet.

DESCRIPTION OF THE PREFERRED EMBODIMENT

Reference will now be made in detail to the present preferred embodiment of the invention as illustrated in the accompanying drawings.

Figure 1:
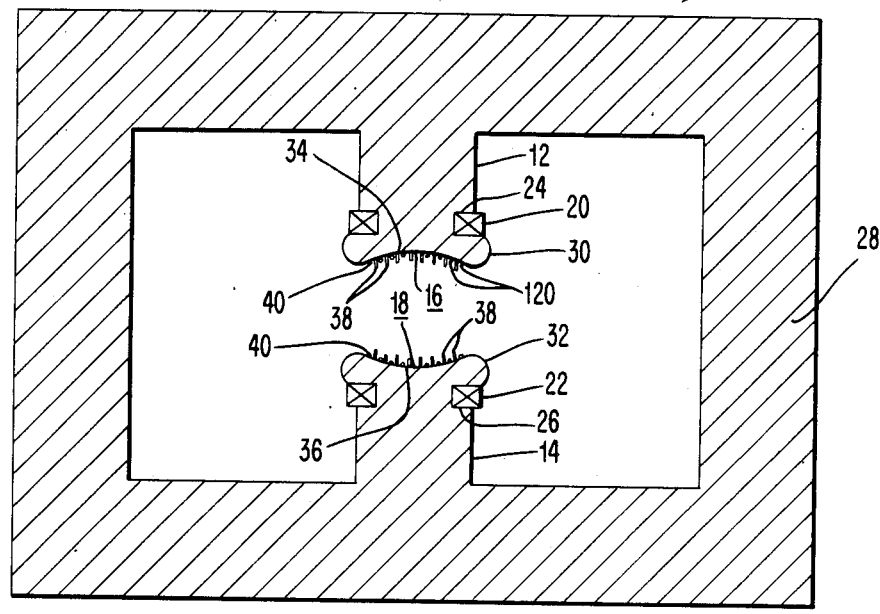
FIG. 1 is a cross sectional view of a magnet incorporating the teachings of the present invention.
Figure 2:
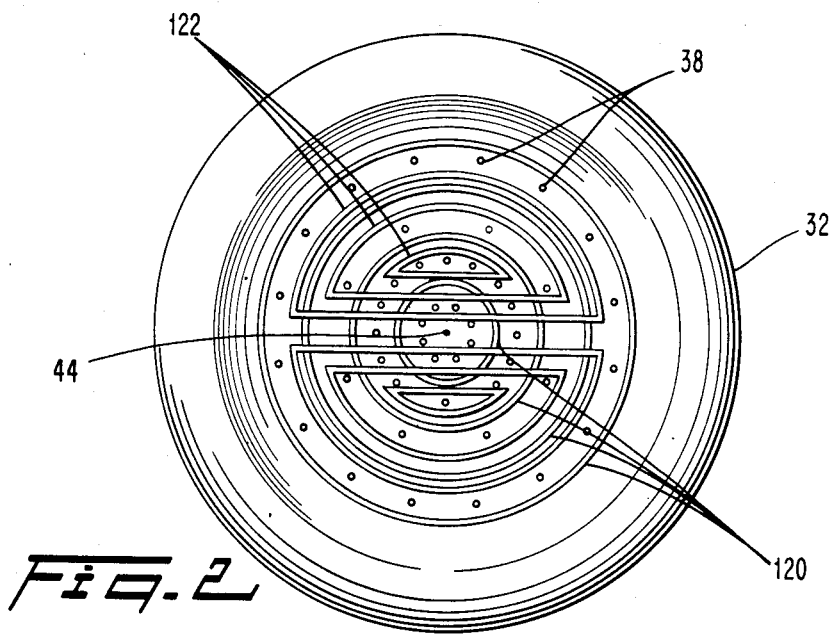
FIG. 2 is an end view of the exposed surface of the lower pole piece of the magnet illustrated in FIG. 1.
Figure 3:
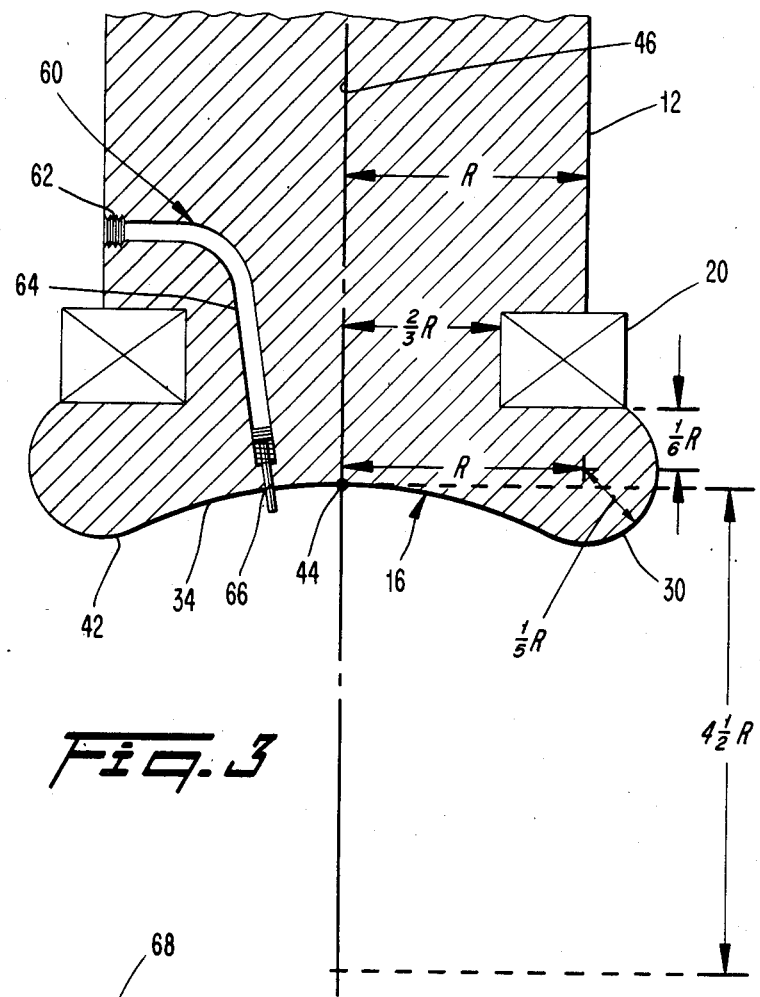
FIG. 3 is a diagram illustrating the geometric configuration of one of the pole pieces of FIG. 1 and includes a cross-sectional view of one hydraulically controlled projection.

In FIGS. 1–3, there is illustrated an electromaget 10 for use in whole body magnetic resonance imaging devices. Electromagnet 10 comprises magnetically conductive pole pieces 12 and 14 which have exposed faces 16 and 18; coils 20 and 22 which are located in respective circumferential indentations or recesses 24 and 26; additional magnetically conductive material 28 in the form of a closed return magnetic flux path; toroidal surfaces 30 and 32; concave surfaces 34 and 36; projections 38; and shim coils 40.

More specifically pole piece 12, and in a like manner pole piece 14, has an exposed surface 16 which is adjusted to fine tune the homogeneity of the magnetic field formed between exposed surfaces 16 and 18 of pole pieces 12 and 14. Without shaping of exposed surfaces 16 and 18 the homogeneity of the resultant magnetic field would be distorted toward the edges of pole pieces 12 and 14. To avoid this distortion, it is preferable that the exposed surfaces 16 and 18 each comprise a first portion 30, 32 of symmetrical toroidal shape. Toroidal surfaces 30, 32 lie along the circumference of the cylinders which form pole piece 12, 14 and preferably project beyond the side surfaces of those cylinders. For example, if pole piece 12 has a radius of R, toroidal surface 30 may be selected to have a major radius R and a minor radius of 0.2R (see FIG. 3). With toroidal surfaces 30 and 32 projecting beyond the side surfaces of the cylinders, coils 20 and 22 may be hidden behind surfaces 30 and 32 to shield coils 20 and 22.

In addition to toroidal surfaces 30, 32 each exposed surface 16, 18 includes a second portion having a concave surface 34, 36 which has a circular edge 42 (FIG. 3) and has a center 44 which lies along the axis of symmetry 46 of the pole piece cylinder. Circular edge 42 preferably has the same height and the same slope as the edge of toroidal surface 30, at the point of contact of toroidal surface 30, and concave surface 34. As a consequence, concave surfaces 34, 36 are tangent to the toroidal surfaces 30, 32 with the edge 42 defining the line of tangency, and toroidal surface 30 and concave surface 34 exhibit a smooth transition from one to the other. In a like manner toroidal surface 32 and concave surface 36 of pole piece 14 also exhibit a smooth transition from one to the other.

By way of example, concave surface 34 may be formed as a section of a sphere having a radius 4.5R.

In order to energize pole pieces 12 and 14, there are provided respective coils 20 and 22 as shown in FIGS. 1 and 3. Coils 20 and 22 may lie in respective recesses 24 and 26 of pole pieces 12 and 14. Accordingly, upon energization of coils 20 and 22, a magnetic field is generated between exposed faces 16 and 18 of pole pieces 12 and 14. With toroidal surfaces 30 and 32 extending beyond the side surfaces of the cylinders which form pole pieces 12 and 14, and with concave surfaces 34 and 36 surrounded by toroidal surfaces 30 and 32, respectively, the homogeneity of the resultant magnetic field is substantially improved over the homogeneity of the field which would result if poles 12 and 14 merely had oppositely facing flat surfaces.

Exposed surfaces 16 and 18, once defined, are rigid and cannot easily be further modified or changed. Accordingly, a plurality of projections 38 are extendable from each of exposed surfaces 16 and 18 toward the opposite pole piece. Projections 38 are formed of magnetically permeable material such as iron or iron alloy. These projections are adjustable in the degree by which they extend beyond the exposed surface of the respectfve pole piece 12 and 14. Preferably, the mechanism for adjusting this distance is hydraulic.

Figure 4:
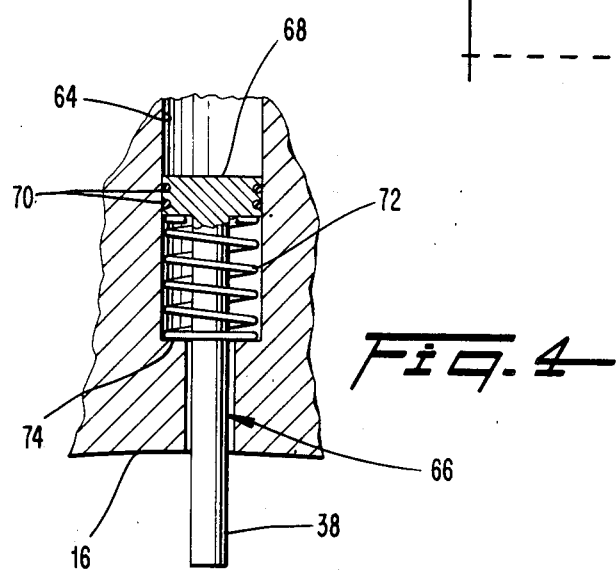
FIG. 4 is an enlarged cross-sectional view of the hydraulically controlled projection illustrated in FIG. 3.

In this regard, in FIGS. 3 and 4 there is shown a hydraulic arrangement 60 which comprises input coupling 62, hydraulic passage 64, pin 66 which includes a head 68 and a projection 38, sealing rings 70, spring 72, and a shoulder 74. Hydraulic fluid enters hydraulic passage 64 through input coupling or opening 62. Head 68 is seated within passage 64 by sealing rings 70. Head 68 of pin 66 is forced away from exposed surface 16 by spring 72 which is lodged between the lower side of head 68 and shoulder 74 of hydraulic passage 64.

Accordingly, as the hydraulic pressure within passage 64 is increased, spring 72 is compressed and projection 38 extends further beyond exposed surface 16. Conversely, as hydraulic pressure within passage 64 is reduced spring 72 expands, reducing the amount of projection which extends beyond exposed surface 16.

A control circuit for hydraulic mechanism 60 is illustrated as part of the circuit of FIG. 5. Specifically, in FIG. 5 a first hydraulic control circuit 80 is shown which comprises a digital latch 82, a digital-to-analog converter 84, an amplifier 86, and a servo control valve 88. Control circuit 80 is coupled by control bus 92 to a computer 94. Computer 94 in turn receives input from magnetic probe 96.

With magnetic probe 96 coupled to an input/output port of computer 94, magnetic probe 96 may be located at a specific point within the magnetic field produced between poles 12 and 14 to measure the magnetic field at that point. Computer 90, as should be apparent to one skilled in the art, can be programmed to react to variations in the comformity of the magnetic field at that point to produce a control signal over control bus 92 which is delivered to digital latch 82, is in turn converted to analog signal by converter 84, and from which is applied to the input of amplifier 86. Amplifier 86 controls the voltage to servo control 88 in response to that signal. Servo control 88 is in turn connected to a hydraulic system which provides hydraulic fluid under pressure to hydraulic passage 64 in proportion to the voltage applied to servo control valve 88. Accordingly, computer 94 may be utilized to rapidly control the amount of hydraulic pressure in passage 64.

A hydraulic system 80 is available for each of the multitude of projections 38 illustrated in FIGS. 1 and 2. Accordingly, as magnetic probe 96 moves throughout the field, computer 94 may be programmed to detect disparities between the intended magnetic field and measured magnetic field, and react to those disparities by producing control signals on control bus 92 which operate to control each servo control valve 88 corresponding to each projection 38.

Returning to FIGS. 1 and 2, there are positioned on the face of each pole piece 16 and 18, shim coils 40 which comprise a first set of shim coils 120 and a second set of shim coils 122. Shim coils 120 have circular symmetry with regard to exposed surfaces 16 and 18. That is to say they are formed in a circle whose center is coincident with center 44 of concave surface 34. Accordingly shim coils 120 may be energized to compensate for circularly symmetric discrepancies in the homogeneity of the resultant magnetic field between pole pieces 12 and 14.

Shim coils 122 are positioned without circular symmetry with regard to exposed surfaces 16 and 18. As illustrated in FIG. 2, shim coils 122 form a series of interposition "D" shaped coil pairs. Although this particular shape is illustrated, other shapes without circular symmetry with regard to the exposed surfaces may be employed to compensate for particular noncircular symmetric disturbances within the magnetic field between poles 12 and 14.

The current through shim coils 120 and 122 may also be computer controlled. Specifically, with reference FIG. 5, a control circuit 130 may be provided for each coil 120 and 122. Control circuit 130 is illustrated in FIG. 5 to comprise a digital latch 132 coupled in series with a digital to analog converter 134 which is in turn coupled in series with amplifier 136. The output of amplifier 136 is coupled through shim coils 120 or 122 and resistor 140 to ground. The input of digital latch 132 is coupled to data bus 92 of computer 94. Accordingly, as magnetic probe 96 detects nonhomogeneity within the magnetic field, appropriate control signals may be passed over data bus 92 to digital latch 132 to control the amount of current passing through a corresponding shim coil 120, 122. Each shim coil 120, 122 may be connected to a corresponding amplifier 136 by a pair of conductors which do not themselves generate any significant magnetic field, for example by a length of coaxial cable or a twisted pair.

Accordingly, by carefully shaping the pole pieces, by placing permeable pieces of material whose exact position can be adjusted under computer control on those surfaces, by placing shim current loops at various locations on the surfaces of the pole pieces and by then permitting modification of the location of the permeable projecting pieces and by changing the current through the shim coils, a substantially homogeneous magnetic field can thus be obtained.

Additional advantages and modifications will readily occur to those skilled in the art. The invention in its broader aspect is, therefore, not limited to the specific details, representative apparatus and illustrative examples shown and described. Accordingly, departures may be made from such details without departing from the spirit or scope of applicant's general inventive concept.

I claim:

1. A magnet for use in a magnetic resonance imaging device, comprising:
  a. first and second pole pieces of magnetically conductive material;
  b. first and second coils located around said first and second pole pieces, respectively, to generate a magnetic field between said pole pieces when said coils are energized;
  c. additional magnetically conductive material arranged to provide a closed loop magnetic flux return path for said pole pieces; and wherein
  d. said pole pieces each include means for uniformly distributing said magnetic field between said pole pieces comprising an exposed surface on each of said pole pieces spaced apart from one another with each said exposed surface having a toroidal portion and a central concave portion surrounded by said toroidal portion, said toroidal portion smoothly transitioning to said central concave portion and said central concave portion comprising a smooth concave indent in said exposed surface.

2. The magnet of claim 1 wherein said means for uniformly distributing further includes a plurality of projections extendable from said central concave portion of at least one of said pole pieces toward said central concave portion of said other pole piece, and means for hydraulically adjusting the distance each said projection extends from said central concave portion of said at least one pole piece.

3. The magnet of claim 1 wherein said means for uniformly distributing further includes a plurality of shim coils arranged on said central concave portions of said first and second pole pieces.

4. The magnet of claim 1 wherein said means for uniformly distributing further includes a plurality of projections extendable from said central concave portion of at least one of said pole pieces toward said central concave portion of said other pole piece, and a plurality of shim coils arranged on said central concave portion of said first and second pole pieces.

5. The magnet of any one of claims 1-4 wherein:
   a. each of said pole pieces comprises a cylinder with said exposed surface at one end thereof and said additional magnetically conductive material at an opposite end thereof;
   b. said toroidal portion comprises a symmetrical surface conforming to a segment of a toroid lying along the circumference of said cylinder and projecting beyond the side surface of said cylinder; and
   c. said central concave portion comprises a concave surface having a circular edge, the center of curvature of which concave surface lies on the axis of symmetry of said cylinder and said circular edge having the same height and slope as the height and slope of the edge of said toroidal portion at the pints of contact of said concave and toroidal portions to provide a smooth transition between said portions.

6. The magnet of any one of claims 1-4 wherein each of said pole pieces comprises a cylinder with said exposed surface at one end thereof and said additional magnetically conductive material at an opposite end thereof; and wherein each of said pole pieces has a circumferential recess in the cylindrical surface thereof, said first coil being located in the recess of said first pole piece and said second coil being located in the recess of said second pole piece.

7. The magnet of any one of claims 1-4 wherein each of said pole pieces comprises a cylinder with said exposed surface at one end thereof and said additional magnetically conductive material at an opposite end thereof; and wherein said cylinder of each pole piece has a radius R, said toroidal portion has a major radius R and a minor radius 0.2R, and said central concave portion comprises a section of a sphere having a radius 4.5R.

8. The magnet of claim 1 or 3 further comprising a plurality of projections extending in the direction of said magnetic field from said central concave portion of at least one of said pole pieces toward the central concave portion of the other pole piece.

9. The magnet of claim 8 wherein said projections are individually adjustable to vary the distance each extends from said central concave portion of said at least one pole piece.

10. The magnet of claim 4 including means for hydraulically adjusting the distance each projection extends from said central concave portion of said at least one pole piece.

11. The magnet of claim 4 wherein said concave central portion of said first pole piece is radially symmetrical and wherein at least a portion of said shim coils are arranged without radial symmetry.

12. The magnet of claim 11 wherein at least a portion of said shim coils are arranged with radial symmetry.

* * * * *